(12) United States Patent     (10) Patent No.:   US 12,575,051 B1

Chigullapalli et al.     (45) Date of Patent:    Mar. 10, 2026

(54) VARIABLE BLANKING PANEL FOR SERVER RACKS

(71) Applicant: AMD Design, LLC, Wilmington, DE (US)

(72) Inventors: Sruti Chigullapalli, Secaucus, NJ (US); Sean Doyle, Secaucus, NJ (US); Karan Mehta, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 253 days.

(21) Appl. No.: 18/447,577

(22) Filed: Aug. 10, 2023

(51) Int. Cl.
    *H05K 7/14*      (2006.01)
    *H05K 5/02*      (2006.01)
    *H05K 7/20*      (2006.01)

(52) U.S. Cl.
    CPC ......... H05K 7/1489 (2013.01); H05K 5/0217 (2013.01); *H05K 7/20709* (2013.01)

(58) Field of Classification Search
    CPC .. H05K 7/1489; H05K 5/017; H05K 7/20709; H05K 7/20736; H05K 7/20745; H05K 7/20781
    See application file for complete search history.

(56) References Cited

U.S. PATENT DOCUMENTS

| | | | | |
|---|---|---|---|---|
| 7,535,709 B2 * | 5/2009 | Fan | ............................ | G06F 1/20 |
| | | | | 174/16.3 |
| 8,456,840 B1 * | 6/2013 | Clidaras | ............. | H05K 7/20745 |
| | | | | 361/679.48 |
| 11,781,780 B1 * | 10/2023 | Lachapelle | ........ | H05K 7/20718 |
| | | | | 454/358 |
| 2009/0133331 A1 * | 5/2009 | Marocco | ................. | E06B 7/086 |
| | | | | 49/91.1 |
| 2010/0214733 A1 * | 8/2010 | Suffern | .............. | H05K 7/20727 |
| | | | | 361/679.46 |
| 2013/0072103 A1 * | 3/2013 | Hopkins | ................. | B23P 11/00 |
| | | | | 454/259 |

\* cited by examiner

*Primary Examiner* — Sagar Shrestha
*Assistant Examiner* — Peter Krim
(74) *Attorney, Agent, or Firm* — Dergosits & Noah LLP; Todd A. Noah

(57)       ABSTRACT

An apparatus and method are provided for varying air flow into a specific rack space from the cold aisle, and to provide an indication of air quality. A blanking panel for a rack space includes rotatable blades that may be positioned in varying states between open and closed to vary the area through which air may flow and, thereby, vary the airflow itself. The blades may be constructed of a material that, when moisture or contaminants are present in the airflow, will indicate the presence by a change in the condition of the material.

17 Claims, 9 Drawing Sheets

VARIABLE BLANKING PANEL FOR SERVER RACKS

BACKGROUND

Typically, to avoid air from the cold aisle bypassing directly to the hot aisle, blanking panels may be used to fill empty rack spaces, e.g., 1 U spaces. Such blanking panels completely block the space, preventing airflow through that space.

However, liquid cooled server racks that use liquid-assisted, air-cooled rear doors may benefit from receiving some bypass airflow, particularly if the bypass air is directed at a section of the rear door that experiences higher temperatures than other sections of the door.

Furthermore, data center air quality has been reducing over the years. Moisture and contaminants in the air are eventually detrimental to the performance of a heat exchanger in the rear door. Early detection of such performance deterioration is desirable, but may not be possible because access to the door is limited by the door's location in the hot-aisle.

Thus, what is needed is an apparatus that may be used to vary air flow into specific rack space from the cold aisle, and an apparatus that may provide an indication of air quality at a specific rack space.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a variable blanking panel and method for varying an air flow through a specific rack space from the cold aisle. Embodiments may also include, in the form of the variable blanking panel and the materials used in its construction, a passive indicator of moisture, or contaminants, or both, in the airflow. Furthermore, when more than one space of a rack is provided with such a variable blanking panel, the relative condition of each blanking panel will indicate where a rear door, e.g., a liquid-assisted, air-cooled rear door, should be inspected for corrosion, or contamination, or both.

In embodiment, a blanking panel is highly configurable, such that it may be adjusted to block an airflow from entering a rack space, or to permit essentially the entire airflow to enter the space or permit some fraction of the airflow to enter. Thus, embodiments may be used to adjust the airflow to the rear door of racks that are so equipped. For example, with liquid cooled server racks that use liquid-assisted, air-cooled rear doors, the cooling ability of the liquid-assisted, air-cooled rear door benefits from receiving some airflow from the cold aisle that bypasses a server and arrives directly at the rear door. The bypass airflow arriving at the rear door thus lowers the average temperature of the air hitting the rear door since the bypass airflow is at a lower temperature than the heated air exiting the servers. By cooling the liquid in the rear door, the bypass airflow increases the ability of the coolant circulating through the rear door to cool the associated servers when that coolant returns to the server coldplates. This is particularly so if the bypass airflow is directed at a section of the rear door that experiences higher temperatures than other sections of the door. For example, the section of the rear door in which the coolant experiences the highest operating temperatures may be the one or more sections that receives coolant directly from server coldplates. Another potential benefit of allowing bypass airflow to reach the rear door is that, by lowering the average temperature of the air arriving at the rear door, the speed of fans in the rear door may be lowered. Lowering fan speeds provides both an energy savings and extended fan life. Generally, airflow from the cold aisle that bypasses the servers and arrives directly at a rear door may be considered to increase the thermal design power (TDP) of the cooling system. As a result, the performance of rear doors can be improved by introducing at least some cool air from cold aisle, so long as other airflow constraints, e.g., the cfm/KW specification, are met.

Figure 1:
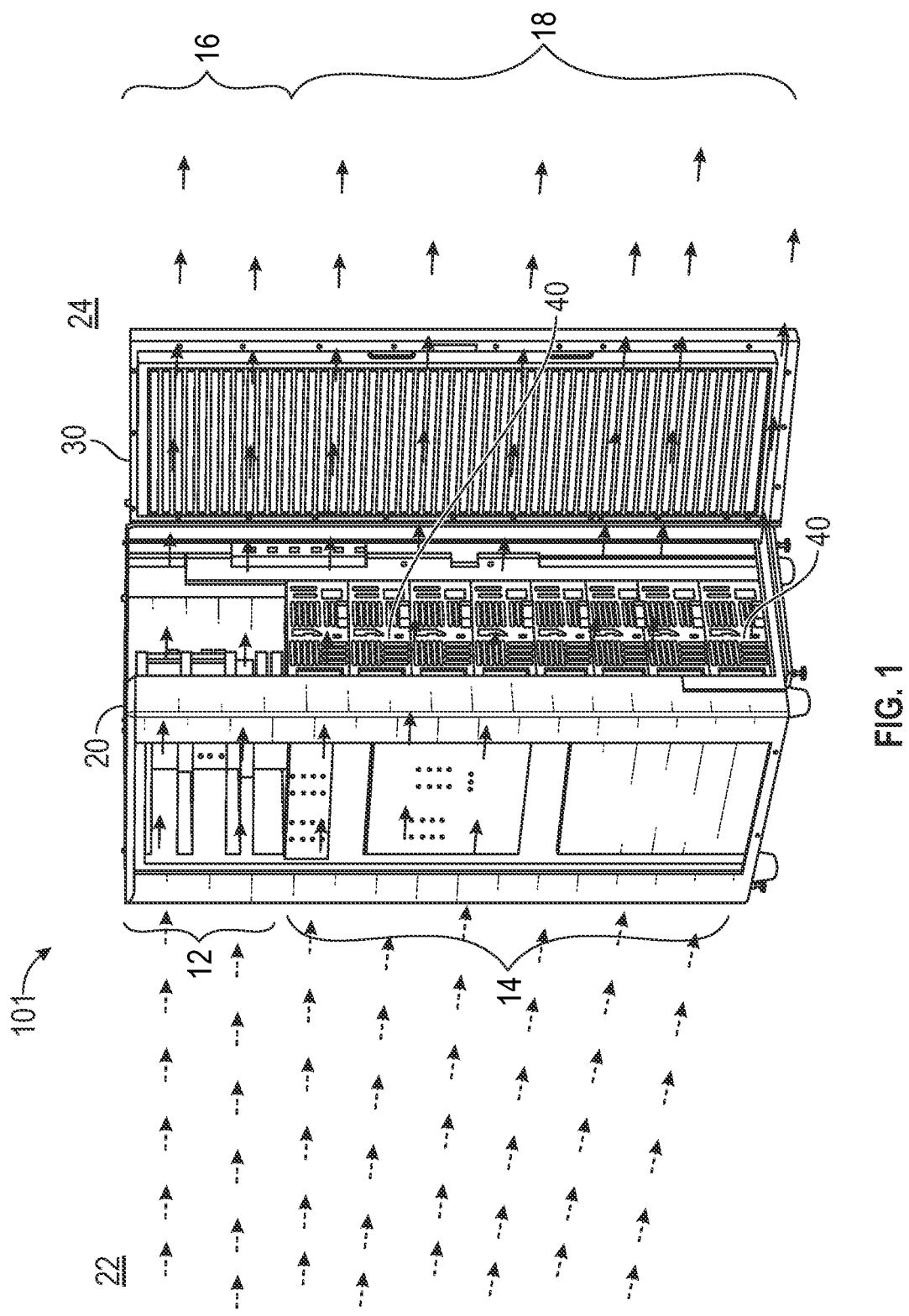
FIG. 1 is a real left perspective view of an embodiment of a rack system including a variable blanking panel.

FIG. 1 is a real left perspective view of an embodiment of a rack system 101. Rack system 101 includes a rack 20, and a rear door 30. Rack 20 is provided with rack spaces, of which the entries to rack spaces 12 are occupied by a variable blanking panel 100 (FIG. 2), and rack spaces 14 are occupied by electronic devices 40, e.g., servers. Rack system 101 is positioned between a cold aisle 22 and a hot aisle 24. Rear door 30 is shown open; however, rear door 30 would be closed when in use. FIG. 1 illustrates that air from cold aisle 22 may pass through spaces 12 unimpeded by devices 40 and through variable blanking panel 100 and exit as unblocked and relatively cold airflow 16. Such airflow 16 through spaces 12 bypasses and is not heated by electronic devices 40, e.g., servers. In contrast, air from cold aisle 22 is prevented from passing freely through spaces 14 by devices 40, is heated by devices 40, and exits as relatively hot airflow 18.

Figure 2:
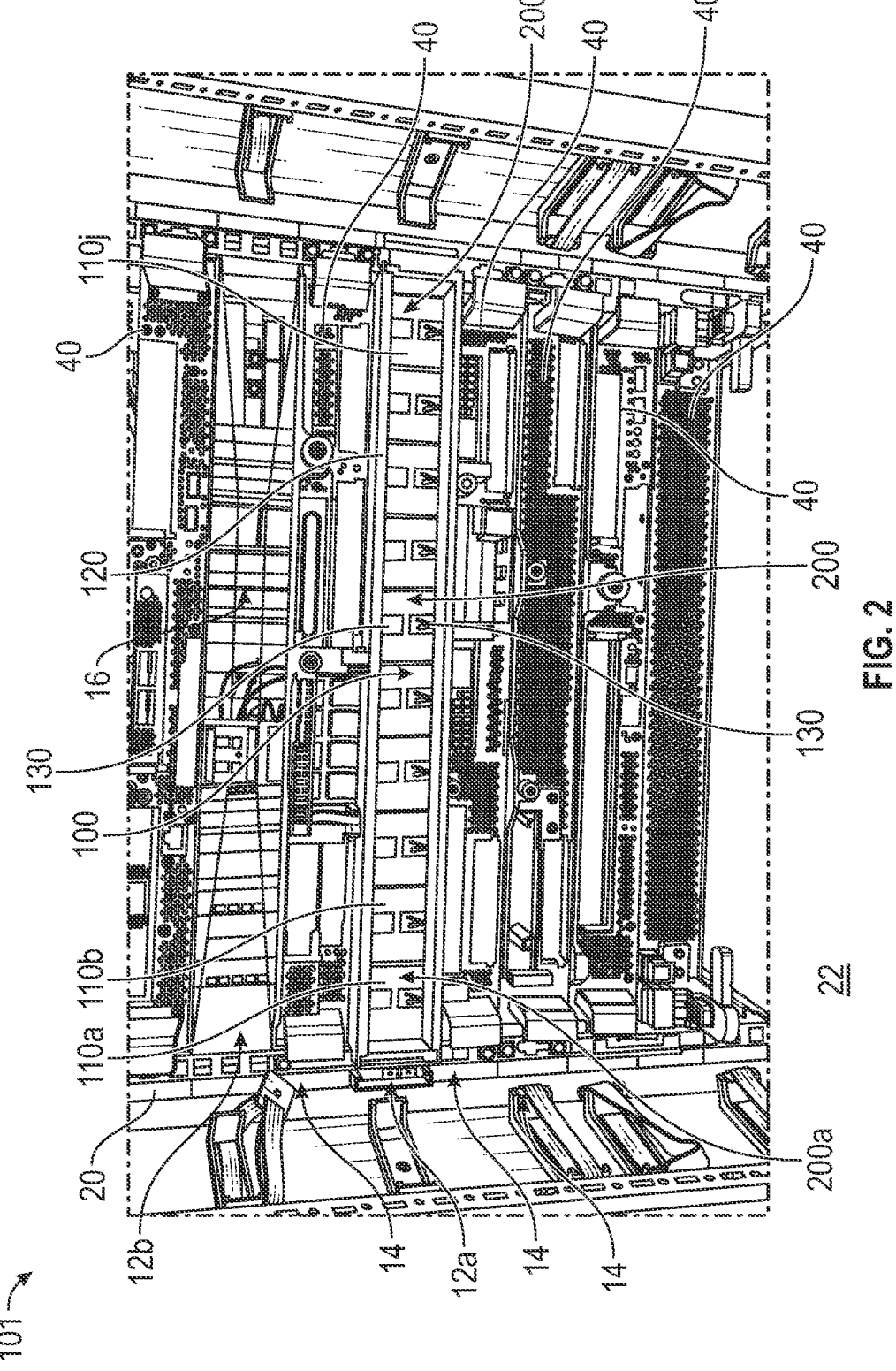
FIG. 2 is a front view of an embodiment of a variable blanking panel in a first state.

FIG. 2 is a front view of an embodiment of rack system 101 including the elements of rack 20 and variable blanking panel 100 in a first, closed state in an unoccupied space 12a. Variable blanking panel 100 includes blade assemblies 110a . . . 110j provided within a frame 120. Each blade assemblies 110a . . . 110j include a pair of inserts 130 that connect a blade 112 to frame 120.

FIG. 2 illustrates that there is little to retard an airflow through unoccupied space 12b. In contrast, blade assemblies 110a . . . 110j may be set at positions between completely open and completely closed to vary airflow 200. Thus, blanking panel 100 may be configured to completely block airflow 200, to allow airflow 200 to pass essentially unhindered, or to prevent some fraction of airflow 200. In addition, FIG. 2 illustrates that each blade assembly, e.g., blade assembly 110a, has an associated airflow, e.g., 200a, that is affected by the setting of the blade assembly.

Figures 3, 4:
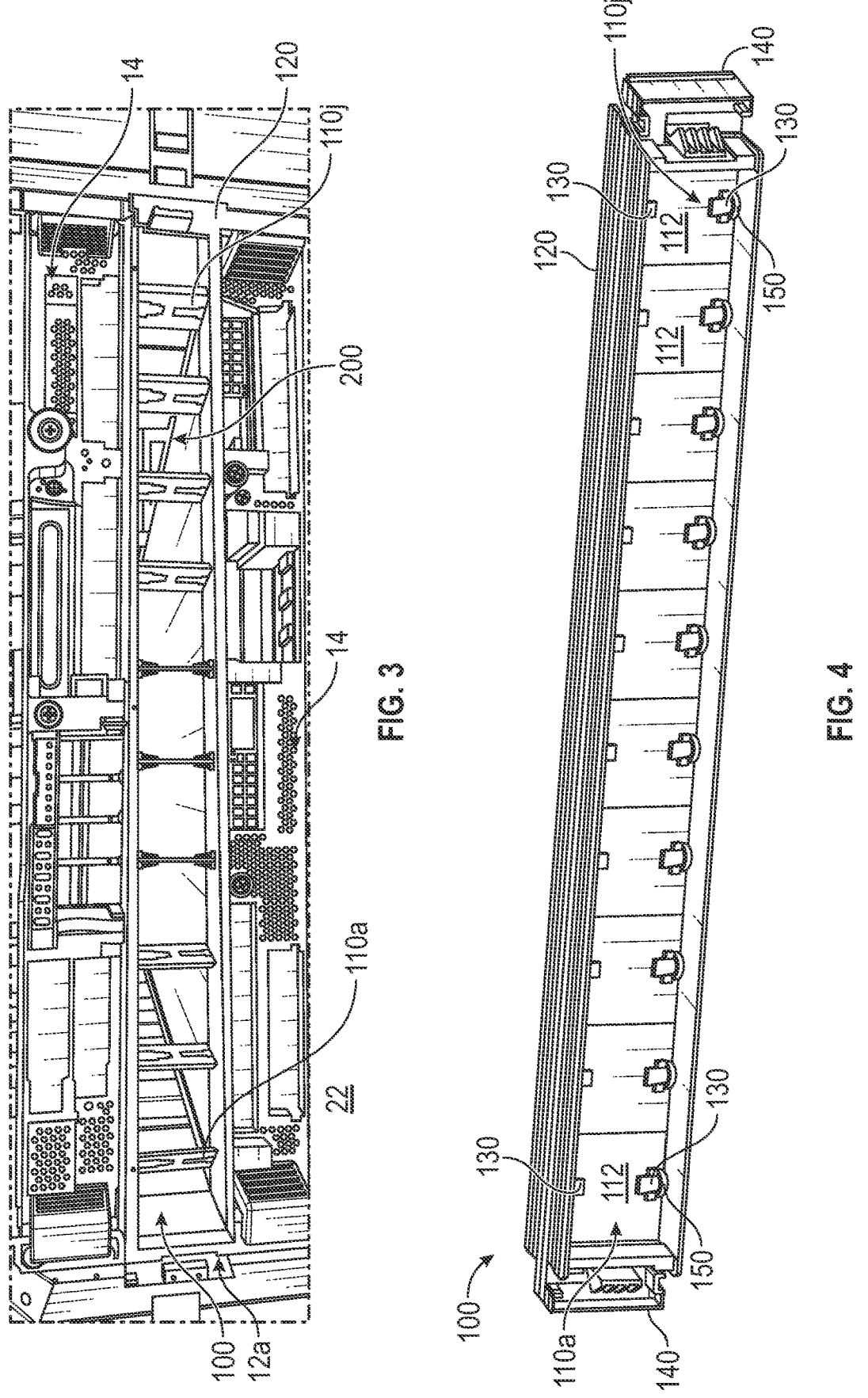
FIG. 3 is a front view of an embodiment of a variable blanking panel in a second state.
FIG. 4 is an upper front right isometric view of an embodiment of a variable blanking panel in a first state.

FIG. 3 is a front view of the embodiment of FIG. 2 in a second, open state. In FIG. 3, blade assemblies 110a . . . 110j have each been rotated to align with airflow 200 and thereby permit as much airflow as possible through unoccupied space 12a.

FIG. 4 is an upper front right isometric view of blanking panel 100 of FIG. 2 in the first, closed state. In FIG. 4, frame 120 is shown to include holders 150, which each receive an insert 130 to retain one side of blade 112. Frame 120 further includes a rack interface 140 at each end, which is configured to engage rack 20 and retain and secure blanking panel 100.

Figures 5, 6:
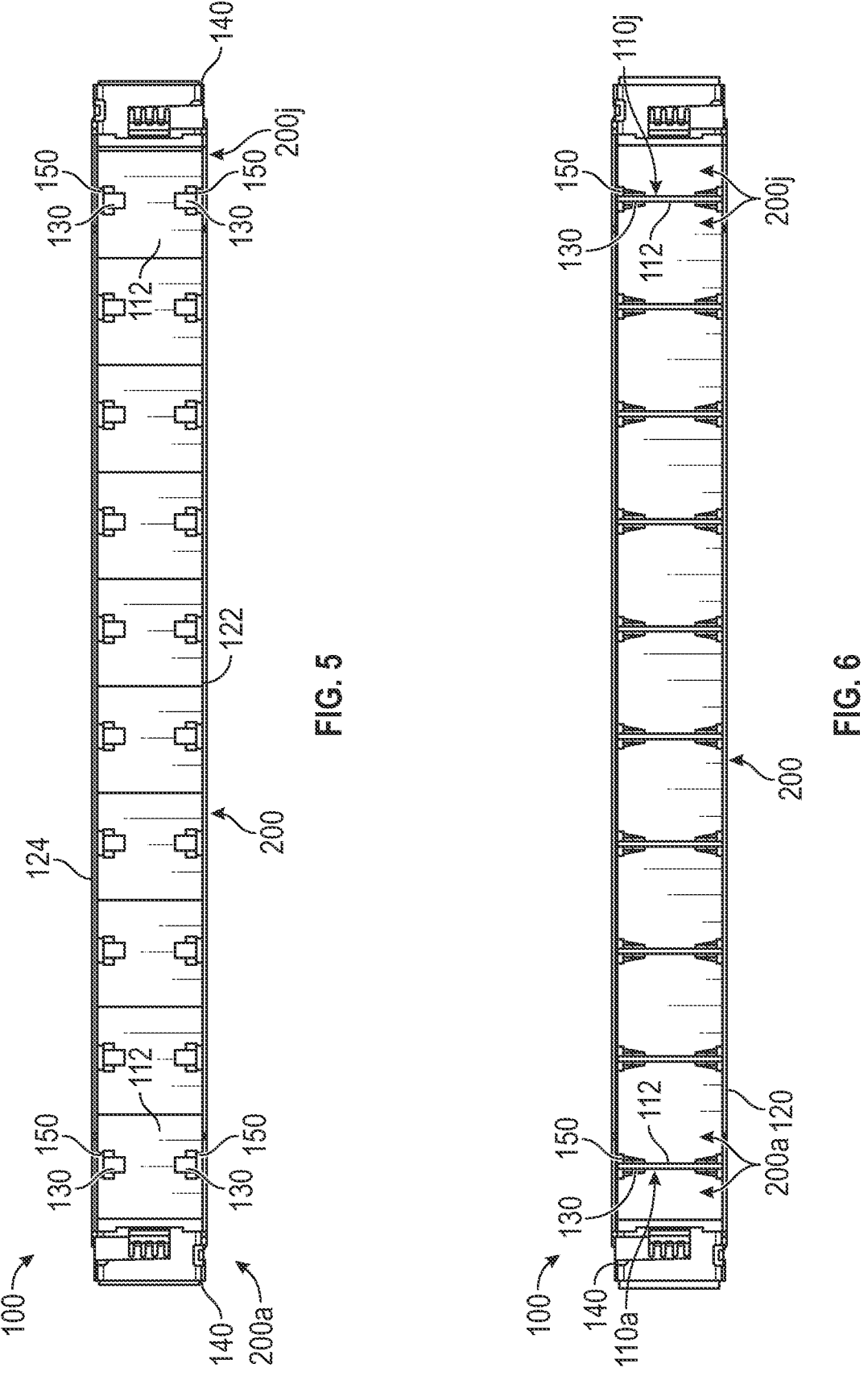
FIG. 5 is a front view of an embodiment of a variable blanking panel in a first state.
FIG. 6 is a front view of an embodiment of a variable blanking panel in a second state.

FIG. 5 is an upper front right isometric view of blanking panel 100 of FIG. 2 in the first, closed state. In FIG. 5, each blade 112 has been rotated to the fully closed position, which completely blocks airflow 200. Frame 120 is shown to include a lower frame side 122 and an upper frame side 124 and that each blade 112 is retained by an insert 130 and holder 150 to both upper frame 124 and lower frame 122.

FIG. 6 is a front view of an embodiment of blanking panel 100 of FIG. 2 in the second, open state. In FIG. 6, each blade 112 has been rotated to the fully open position, which provides the most available area for airflow 200, i.e., the sum of airflows 200a . . . 200j.

Figure 7A:
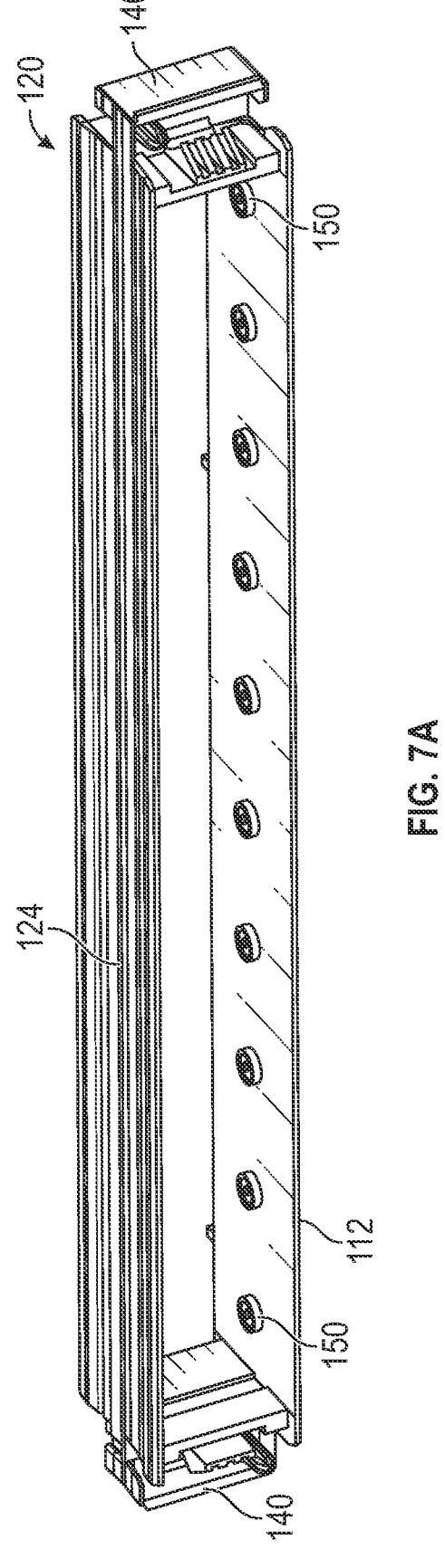
FIG. 7A is an upper front right isometric view of aspects of an embodiment of a variable blanking panel.
Figure 7B:
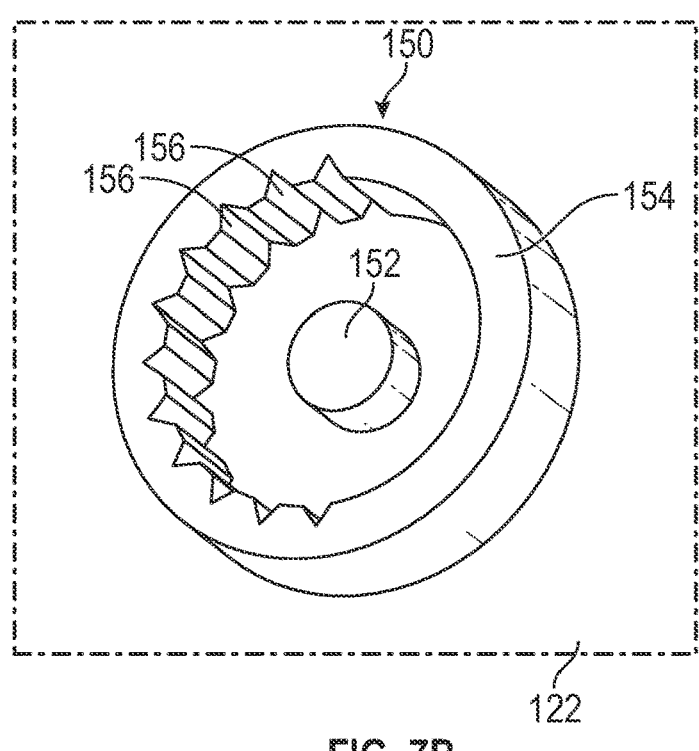
FIG. 7B is an upper front right isometric view of aspects of an embodiment of a variable blanking panel.
Figure 7C:
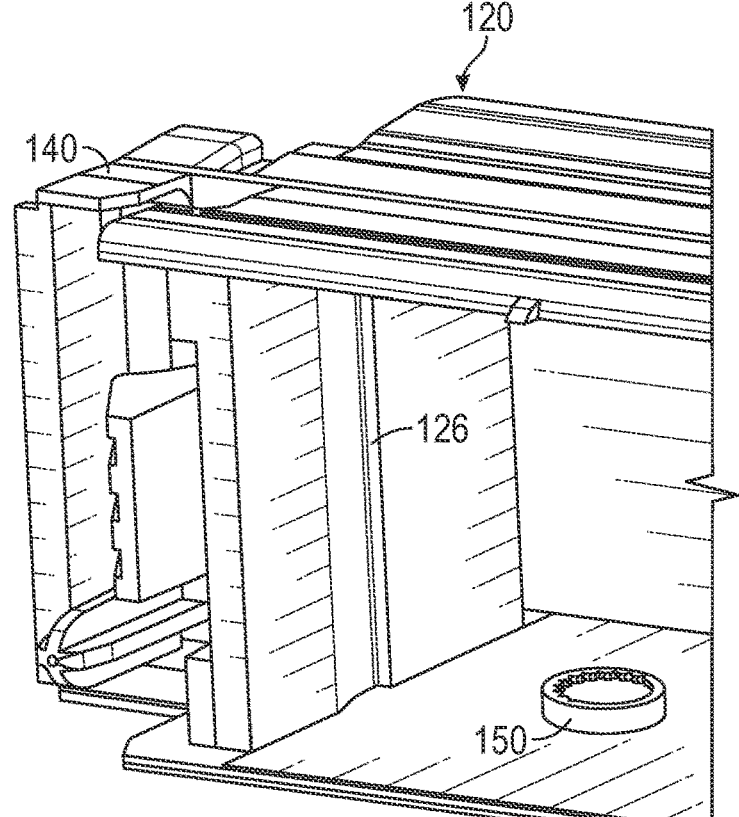
FIG. 7C is an upper front right isometric view of aspects of an embodiment of a variable blanking panel.

FIG. 7A is an upper front right isometric view of aspects of blanking panel 100, namely the positions of holders 150 on lower frame 122. Upper frame 124 includes identical holders 150 similarly positioned (FIG. 5, FIG. 6). In FIG. 7B, each holder 150 is shown to include a ring 154 about a post 152. Ring 154 includes a plurality of detents 156. As shown, detents 156 are provided on approximately half the inner surface of ring 154. In FIG. 7C, frame 126 is shown to include a blade seat face 126. Each end of frame 120 is similarly configured.

Figure 8A:
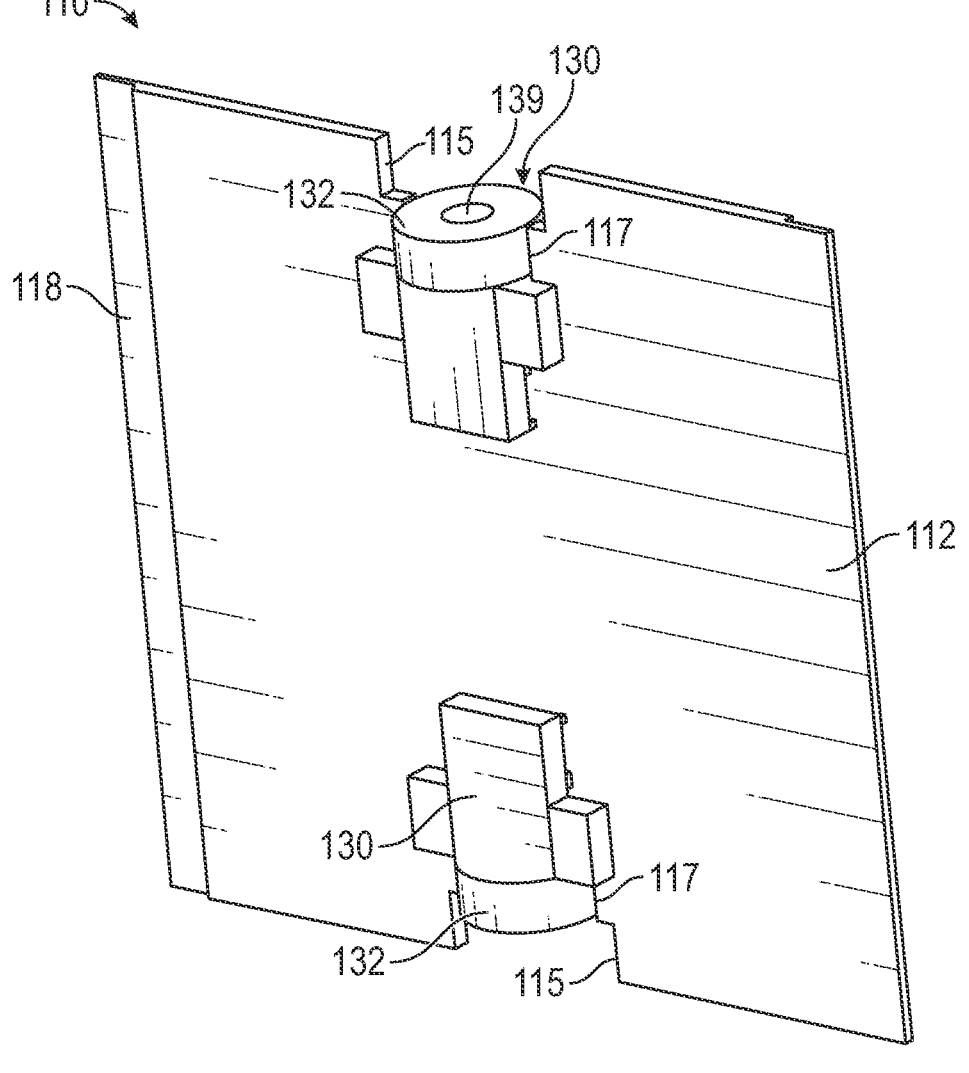
FIG. 8A is an upper front right isometric view of aspects of an embodiment of a variable blanking panel.
Figure 8B:
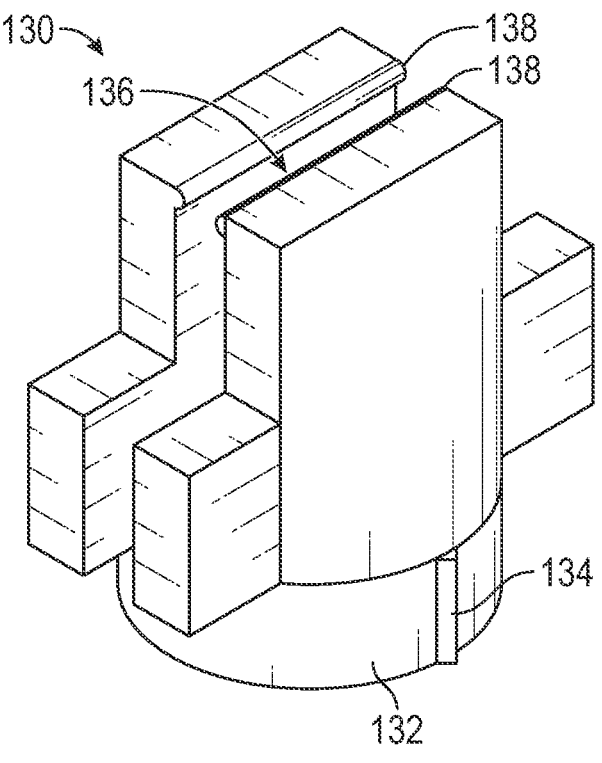
FIG. 8B is an isometric view of aspects of an embodiment of a variable blanking panel.
Figure 8C:
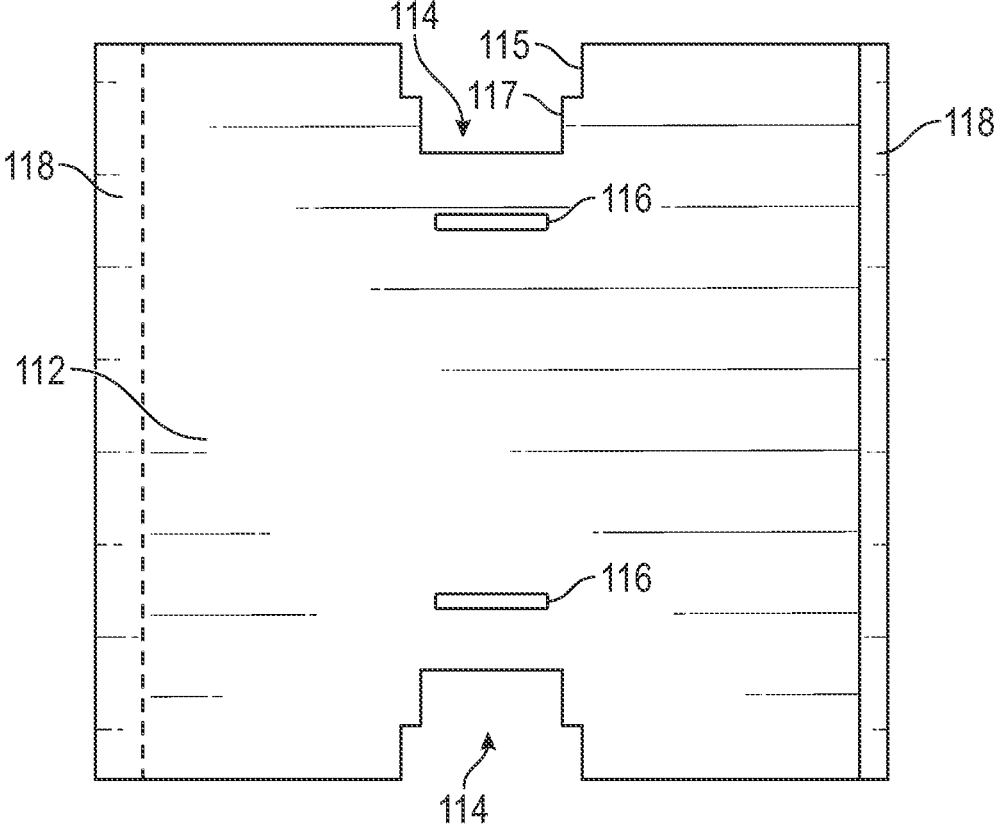
FIG. 8C is a front view of aspects of an embodiment of a variable blanking panel.

FIG. 8A-FIG. 8C illustrate aspects of rotatable blade assembly 110 of blanking panel 100. The description with respect to FIG. 8A-FIG. 8C applies to each rotatable blade assembly 110, i.e., assemblies 110a . . . 110j. With regard to FIG. 8C, in the embodiment, each blade 112 is symmetric about a horizontal line. On the top and bottom sides, which are adjacent to upper and lower frames 122, 124, blade 112 is provided with slots or grooves 116 and notches 114, each notch having a pair of edges 115 and 117. On the lateral sides, blade 112 is provided with a face 118. As illustrated, face 118 is created by notch such that the plane of face 118 is parallel to the plane of the majority of blade 112. In embodiments, face 118 may be a bevel and at an angle to the majority of blade 112. With regard to FIG. 8B, insert 130 includes a slot 136 configured to receive blade 112. A tooth 138 extends from either side of slot 136. Each tooth 138 is configured to engage slot 116 of blade 112 when blade 112 is inserted into slot 136, thus retaining blade 112 within slot 136 in an "installed" position such that the bottom of insert base 132 is even with the edge of blade 112. When blade 112 is between two inserts 130 in the installed position and the inserts 130 are received within holders 150, the blade/insert assembly is retained within variable blanking panel 100. Insert base 132 is shown to include a base tooth 134, which releasably engages detents 156 of holder 150 when blanking panel 100 is assembled. As shown by FIG. 8A, with insert

130 pushed toward the center of blade 112, teeth 138 disengage from slot 116 and blade 112 is received further within slot 138. Base 132 is, as a result, recessed within notch 114 to the depth of edge 115. This "removal/installation" position allows for the blade/insert assembly to be removed from or installed into variable blanking panel 100 because bases 132 no longer engage or interfere with holders 150 when the blade/insert assembly is positioned within variable blanking panel 100 and between two holders 150. A hole 139 indicates where holder post 152 is received by insert base 132 when insert 130 is extended outwardly such that tooth 138 engages slot 116, which maintains blade/insert assembly within variable blanking panel 100.

Figure 9:
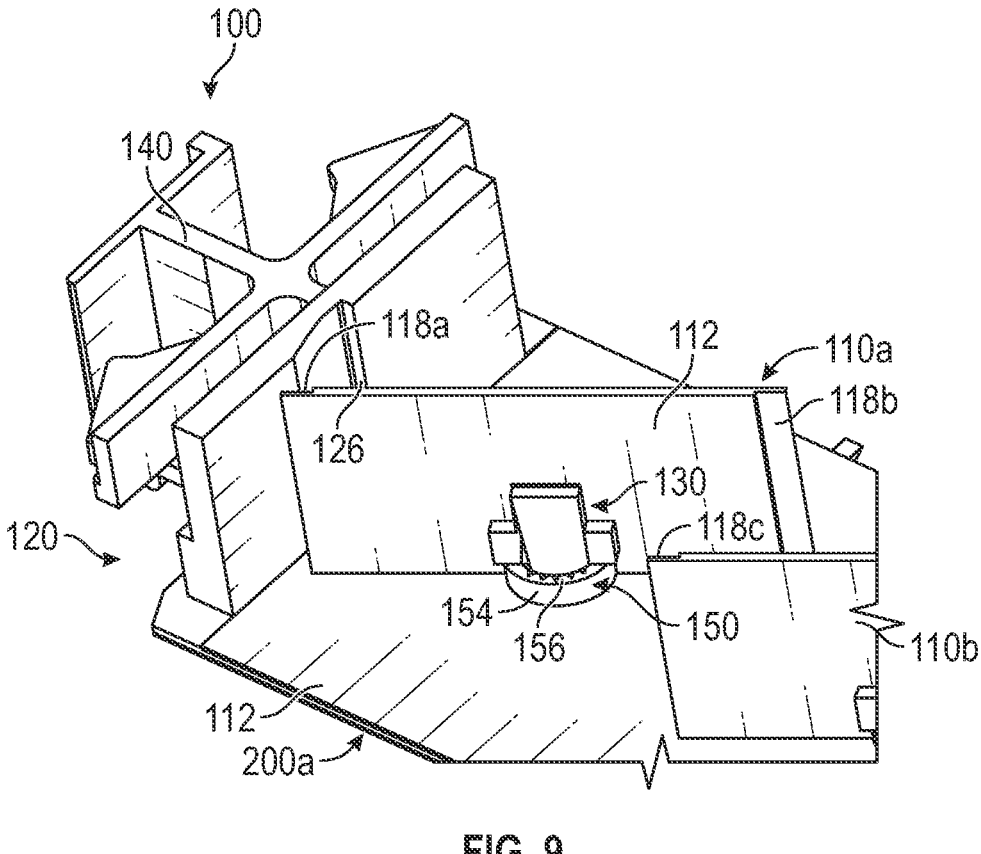
FIG. 9 is an upper front right isometric sectional view of aspects of an embodiment of a variable blanking panel.

FIG. 9 is an upper front right isometric sectional view of aspects of variable blanking panel 100. When assembled, insert 130 is received by holder 150 with insert base 132 within base ring 154. Thus, base tooth 134 is positioned to engage detents 156. In addition, FIG. 9 illustrates that face 118a contacts blade seat face 126 when blade assembly 110a is fully closed. Similarly, when both blade assemblies 110a, 110b are fully closed, blade seat faces 118b and 118c are in contact, which increases the efficiency of the seal.

Thus, in embodiments, a blanking panel may employ rotatable blades with detents that allow the blades to be positioned in open, closed, and intermediate angles, and thereby variably restrict the airflow through the associated rack space. In addition, the variable blade angles also facilitate directing airflow within the rack space, including through the use of ducting if needed, which may improve the efficiency of the airflow through the rack space. In an embodiment, blade assemblies 110 may be removable for serviceability or to allow maximum airflow. In an embodiment, in addition to allowing airflow into unoccupied rack space, blades 112 may be made of specific materials, e.g., materials similar to or the same as the materials of the rear door, that also help in detecting contaminants in airflow 200 such as moisture and other corrosive elements. For example, rear door 30 is typically closed when in use and it's condition is difficult to determine. Blades 112, on the other hand, are readily visible from the front of rack 20. Airflow 16 through blades 112 may be assumed to have the same negative effect on blades 112 as airflow 16 and airflow 18 have on elements of rear door 30. Thus, given blades 112 and rear door 30 start with a similar initial condition, the subsequent condition of blades 112 can be assumed to represent the condition of elements of rear door 30. Then, when blades 112 show evidence of contamination or corrosion, the state of blades 112 can be attributed to rear door 30. If the attributed evidence warrants, steps may be taken to ameliorate the condition indicated by the evidence seen on blades 112, i.e., the potential contamination or corrosion of rear door 30. For example, amelioration steps may include one or more of: an immediate inspection, an increased inspection frequency, a rear door repair, or a rear door replacement.

As described above, embodiments provide one or more of the following features: an adjustable flow rate ranging from ~0% to ~100% of an available air flow; an ability to set blades 112 at a position and have that position be retained during use, such that, e.g., blade position may be set at the factory and leave it without worrying about shifting during use; an ability to set blades 112 to control direction of the airflow through unoccupied rack space; an ability to indicate the presence of air moisture and contaminants (corrosive elements) in the airflow through a change in the condition of blade 112; an ability to adjust airflow to the rear of the rack from the front of the rack; and scalability—frame 120 and blade assemblies 110 may be size to any sized U space and rack width, e.g., from 1 RU to 10 OU.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a frame including an inner passage and a first plurality of rings around a first plurality of posts on a first side of the frame, each ring of the first plurality of rings being positioned around a respective one of the first plurality of posts and having an inner surface with a plurality of detents;
a first plurality of inserts, each insert of the first plurality of inserts having a base with a first hole, each post of the first plurality of posts being rotatably received within the first hole of the respective insert of the first plurality of inserts, each base having a tooth on an outer surface of the base configured to releasably engage each of the plurality of detents, respectively, of the corresponding ring when the corresponding insert is rotated between a closed position and an open position; and
a plurality of blades rotatably secured within the frame, each blade of the plurality of blades being connected to a respective one of the first plurality of inserts, the plurality of blades being configured to block the inner passage when each insert of the plurality of inserts is in the closed position.

2. The apparatus of claim 1, wherein:
each blade is constructed of a corrosion-susceptible material.

3. The apparatus of claim 1, wherein:
the frame includes a second plurality of rings around a second plurality of posts on a second side of the frame, each ring of the second plurality of rings being positioned around a respective one of the second plurality of posts;
a second plurality of inserts, each insert of the second plurality of inserts having a second base with a second hole, each post of the second plurality of posts being rotatably received within the second hole of the respective insert of the second plurality of inserts; and
each blade of the plurality of blades being connected to a respective one of the second plurality of inserts.

4. The apparatus of claim 3, wherein, for each blade,
the first plurality of inserts being identical to the second plurality of inserts.

5. The apparatus of claim 4, wherein, for each blade:
a third side of the blade includes a first face and a fourth side of the blade includes a second face; and
the plurality of blades are dispersed within the frame such that each first face contacts a second face of an adjacent blade when each blade is in the closed position, except for a blade adjacent to either a first end or a second end of the frame.

6. The apparatus of claim 5, wherein:
the frame includes a third face at the first end and a fourth face at the second end; and
the third face contacts the first face of a first adjacent blade adjacent to the first end and the fourth face contacts the second face of a second adjacent blade adjacent to the second end when each blade is in the closed position.

7. The apparatus of claim 6, wherein:
each blade is provided with a first slot and a second slot;
each insert is provided with third slot and a tooth; and,
for each blade, the blade is retained within the third slot of the first insert by the tooth of the first insert being received by the first slot and is retained within the third slot of the second insert by the tooth of the second insert being received by the second slot.

8. A system comprising:
a rack including a plurality of spaces for electronic devices, at least one of the spaces including a blanking panel including:
a frame including an inner passage and a first plurality of rings around a first plurality of posts on a first side of the frame, each ring of the first plurality of rings being positioned around a respective one of the first plurality of posts and having an inner surface with a plurality of detents;
a first plurality of inserts, each insert of the first plurality of inserts having a base with a first hole, each post of the first plurality of posts being rotatably received within the first hole of the respective insert of the first plurality of inserts, each base having a tooth on an outer surface of the base configured to releasably engage each of the plurality of detents, respectively, of the corresponding ring when the corresponding insert is rotated between a closed position and an open position; and
a plurality of blades rotatably secured within the frame, each blade of the plurality of blades being connected to a respective one of the first plurality of inserts, the plurality of blades being configured to block the inner passage when each insert of the plurality of inserts is in the closed position.

9. The apparatus of claim 8, wherein:

each blade is constructed of a corrosion-susceptible material.

10. The apparatus of claim 8, wherein:

the frame includes a second plurality of rings around a second plurality of posts on a second side of the frame, each ring of the second plurality of rings being positioned around a respective one of the second plurality of posts;

a second plurality of inserts, each insert of the second plurality of inserts having a second base with a second hole, each post of the second plurality of posts being rotatably received within the second hole of the respective insert of the second plurality of inserts; and each blade of the plurality of blades being connected to a respective one of the second plurality of inserts.

11. The apparatus of claim 10, wherein, for each blade, the first plurality of inserts being identical to the second plurality of inserts.

12. The apparatus of claim 11, wherein, for each blade:

a third side of the blade includes a first face and a fourth side of the blade includes a second face; and the plurality of blades are dispersed within the frame such that each first face contacts a second face of an adjacent blade when each blade is in the closed position, except for a blade adjacent to either a first end or a second end of the frame.

13. The apparatus of claim 12, wherein:

the frame includes a third face at the first end and a fourth face at the second end; and the third face contacts the first face of a first adjacent blade adjacent to the first end and the fourth face contacts the second face of a second adjacent blade adjacent to the second end when each blade is in the closed position.

14. The apparatus of claim 13, wherein:

each blade is provided with a first slot and a second slot;

each insert is provided with third slot and a tooth; and, for each blade, the blade is retained within the third slot of the first insert by the tooth of the first insert being received by the first slot and is retained within the third slot of the second insert by the tooth of the second insert being received by the second slot.

15. A method comprising:

providing a rack including a plurality of spaces for electronic devices with, in at least one of the spaces, a blanking panel including:

a frame including an inner passage and a first plurality of rings around a first plurality of posts on a first side of the frame, each ring of the first plurality of rings being positioned around a respective one of the first plurality of posts and having an inner surface with a plurality of detents, a first plurality of inserts, each insert of the first plurality of inserts having a base with a first hole, each post of the first plurality of posts being rotatably received within the first hole of the respective insert of the first plurality of inserts, each base having a tooth on an outer surface of the base configured to releasably engage each of the plurality of detents, respectively, of the corresponding ring when the corresponding insert is rotated between a closed position and an open position, and a plurality of blades rotatably secured within the frame, each blade of the plurality of blades being connected to a respective one of the first plurality of inserts, the plurality of blades being configured to block the inner passage when each insert of the plurality of inserts is in the closed position; and adjusting, for each blanking panel, the positions of each blade of the plurality of blades of the blanking panel to reduce an airflow through the associated space.

16. The method of claim 15, wherein:

the frame includes a second plurality of rings around a second plurality of posts on a second side of the frame, each ring of the second plurality of rings being positioned around a respective one of the second plurality of posts;

a second plurality of inserts, each insert of the second plurality of inserts having a second base with a second hole, each post of the second plurality of posts being rotatably received within the second hole of the respective insert of the second plurality of inserts; and each blade of the plurality of blades being connected to a respective one of the second plurality of inserts.

17. The method of claim 16, wherein, for each blade, the first plurality of inserts being identical to the second plurality of inserts.

* * * * *